(12) United States Patent
Dogiamis et al.

(10) Patent No.: US 11,476,554 B2
(45) Date of Patent: Oct. 18, 2022

(54) MMWAVE WAVEGUIDE TO WAVEGUIDE CONNECTORS FOR AUTOMOTIVE APPLICATIONS

(71) Applicant: Intel Corporation, Santa Clara, CA (US)

(72) Inventors: Georgios Dogiamis, Chandler, AZ (US); Sasha Oster, Marion, IA (US); Telesphor Kamgaing, Chandler, AZ (US); Erich Ewy, Phoenix, AZ (US); Adel Elsherbini, Chandler, AZ (US); Johanna Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 323 days.

(21) Appl. No.: 16/613,386

(22) PCT Filed: Jul. 1, 2017

(86) PCT No.: PCT/US2017/040554
§ 371 (c)(1),
(2) Date: Nov. 13, 2019

(87) PCT Pub. No.: WO2019/009875
PCT Pub. Date: Jan. 10, 2019

(65) Prior Publication Data
US 2020/0076040 A1 Mar. 5, 2020

(51) Int. Cl.
*H01P 3/16* (2006.01)
*H01P 5/02* (2006.01)
(Continued)

(52) U.S. Cl.
CPC ............ *H01P 5/02* (2013.01); *B60R 16/0231* (2013.01); *H01L 23/66* (2013.01); *H01L 25/18* (2013.01);
(Continued)

(58) Field of Classification Search
CPC ...... H01P 5/02; H01P 5/00; H01P 3/16; H01P 1/04; H01L 23/66; H01L 25/18;
(Continued)

(56) References Cited

U.S. PATENT DOCUMENTS

| 4,088,390 A | 5/1978 | Mccartney |
| 4,412,192 A | 10/1983 | Paolino |

(Continued)

OTHER PUBLICATIONS

International Preliminary Report on Patentability for International Patent Application No. PCT/US2017/040554, dated Jan. 16, 2020, 9 pages.

(Continued)

*Primary Examiner* — Stephen E. Jones
(74) *Attorney, Agent, or Firm* — Schwabe, Williamson & Wyatt, P.C.

(57) ABSTRACT

Embodiments of the invention include dielectric waveguides and connectors for dielectric waveguides. In an embodiment a dielectric waveguide connector may include an outer ring and one or more posts extending from the outer ring towards the center of the outer ring. In some embodiments, a first dielectric waveguide secured within the dielectric ring by the one or more posts. In another embodiment, an enclosure surrounding electronic components may include an enclosure wall having an interior surface and an exterior surface and a dielectric waveguide embedded within the enclosure wall. In an embodiment, a first end of the dielectric waveguide is substantially coplanar with the interior surface of the enclosure wall and a second end of the dielectric waveguide is substantially coplanar with the exterior surface of the enclosure wall.

25 Claims, 7 Drawing Sheets

(51) Int. Cl.
*B60R 16/023* (2006.01)
*H01L 23/66* (2006.01)
*H01L 25/18* (2006.01)
*H01R 13/622* (2006.01)
*H01R 13/631* (2006.01)
*H01R 13/646* (2011.01)
*H05K 1/18* (2006.01)
*H05K 5/00* (2006.01)
*H05K 5/02* (2006.01)
*H05K 7/20* (2006.01)

(52) U.S. Cl.
CPC ............. *H01P 3/16* (2013.01); *H01R 13/622* (2013.01); *H01R 13/631* (2013.01); *H01R 13/646* (2013.01); *H05K 1/181* (2013.01); *H05K 5/0017* (2013.01); *H05K 5/0247* (2013.01); *H01L 2223/6627* (2013.01); *H05K 7/20872* (2013.01); *H05K 2201/10378* (2013.01); *H05K 2201/10522* (2013.01); *H05K 2201/10734* (2013.01)

(58) Field of Classification Search
CPC ........ H01L 2223/6627; B60R 16/0231; H01R 13/622; H01R 13/631; H01R 13/646; H05K 1/181; H05K 5/0017; H05K 5/0247; H05K 2201/10378; H05K 2201/10522

See application file for complete search history.

(56) References Cited

U.S. PATENT DOCUMENTS

2015/0293039 A1* 10/2015 Herbsommer ......... G01N 22/00
                                                            324/641
2015/0340805 A1* 11/2015 Jordan ................. H01R 13/639
                                                            439/338
2016/0308266 A1   10/2016 Hammerschmidt
2017/0040754 A1    2/2017 Vaccaro
2017/0170538 A1    6/2017 Morgan et al.

OTHER PUBLICATIONS

International Search Report and Written Opinion for International Patent Application No. PCT/US2017/040554 dated Mar. 22, 2018, 12 pgs.
Office Action from Taiwan Patent Application No. 107112900, dated Sep. 3, 2021, 6 pages.
Office Action from Taiwan Patent Application No. 107112900, dated Nov. 29, 2021, 3 pages.

* cited by examiner

MMWAVE WAVEGUIDE TO WAVEGUIDE CONNECTORS FOR AUTOMOTIVE APPLICATIONS

CROSS-REFERENCE TO RELATED APPLICATION

This patent application is a U.S. National Phase Application under 35 U.S.C. § 371 of International Application No. PCT/US2017/040554, filed Jul. 1, 2017, entitled "MMWAVE WAVEGUIDE TO WAVEGUIDE CONNECTORS FOR AUTOMOTIVE APPLICATIONS," which designates the United States of America, the entire disclosure of which is hereby incorporated by reference in its entirety and for all purposes.

FIELD OF THE INVENTION

Embodiments of the invention are in the field of semiconductor packaging and, in particular, formation of mm-wave interconnects for use in automotive applications.

BACKGROUND OF THE INVENTION

Figure 1:
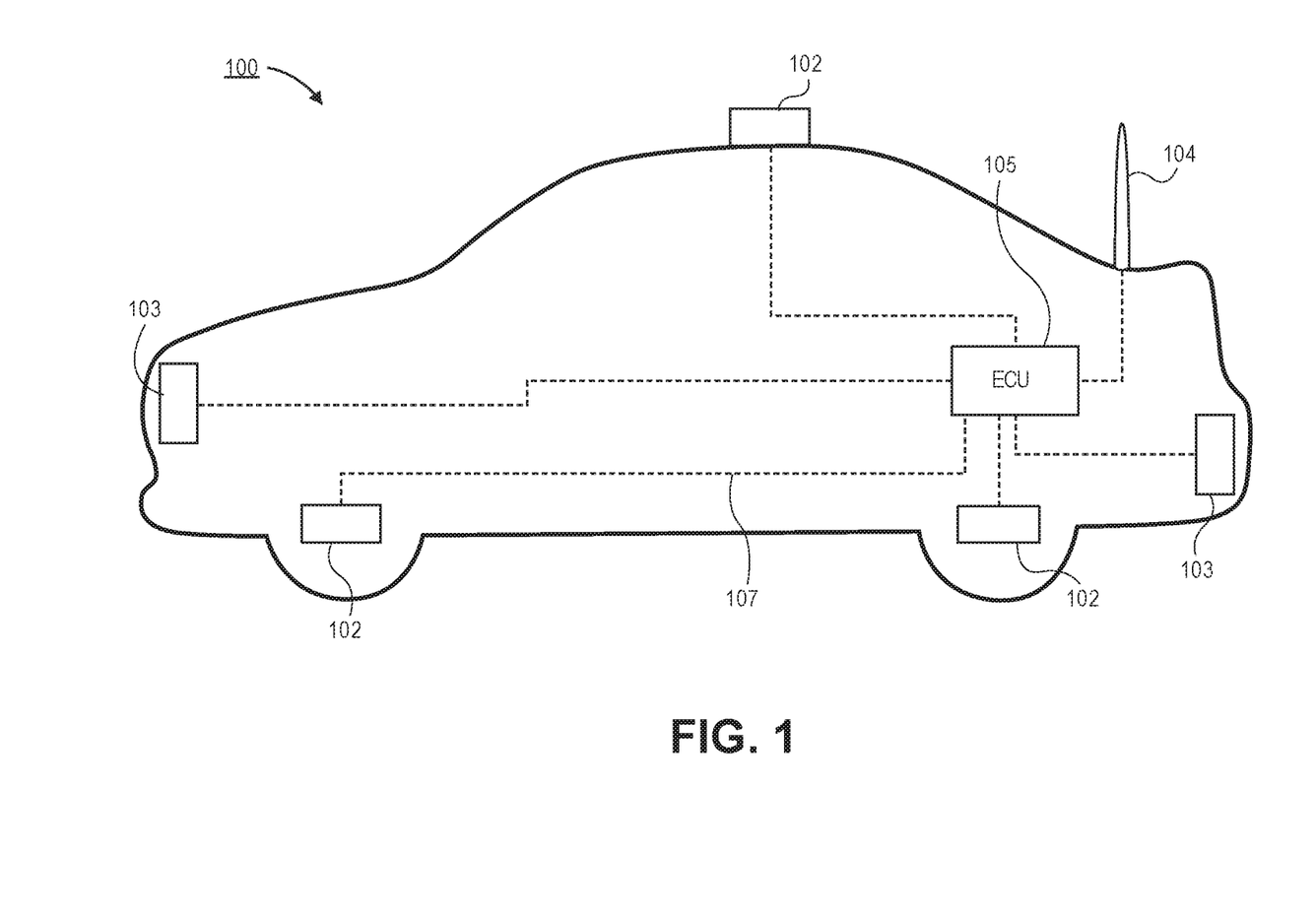
FIG. 1 is a schematic of an automobile that includes a plurality of sensors and other peripheral components that are communicatively linked to an electronic control unit (ECU), according to an embodiment of the invention.

The automotive industry is rapidly progressing towards the production of autonomous and/or self-driving vehicles. Autonomous vehicles utilize many sensors that generate data regarding the position of the vehicle relative to surrounding objects, such as the road, other cars, traffic signals, lane markings, pedestrians, and the like. As illustrated in FIG. 1, a vehicle 100 may include any number of sensors 102, video cameras 103, and positioning systems 104, such as global positioning systems (GPS). For example, sensors 102 may include video sensors, image sensors, ultrasonic sensors, radar sensors, light detection and ranging (LIDAR) sensors, or the like. The data generated from these components needs to be processed in order to determine how the vehicle needs to react. As such, the generated data is transferred from the peripheral components to an electronic control unit (ECU) 105 over one or more interconnects 107. Furthermore, connectors (not shown in FIG. 1) used to link interconnects 107 to the ECU 105 and the peripheral components (e.g., sensors 102, cameras 103, positioning systems 104, etc.) need to comply with stringent environmental requirements in the automotive industry. For example, the enclosures surrounding the ECU 105 and peripheral components often need to be dust and moisture proof. Additionally, the connectors may need to minimize the effects of vibration in order to ensure proper alignment of the interconnects 107.

In addition to the maintaining highly reliable systems in view of the environmental factors, the additional peripheral sensors and other components needed for autonomous and/or self-driving vehicle results in a significant increase in the amount of data that is transferred within the vehicle. Currently, autonomous vehicles that are being tested utilize data-transfers at rates between approximately 1.0 Gbps and 1.5 Gbps and employ four different low-voltage differential signaling (LVDS) lanes to allow for a total data rate between approximately 4.0 Gbps and 6.0 Gbps. However, the data rate needed in the subsequent generations of autonomous vehicles is expected to increase to approximately 10 Gbps or more (i.e., approximately 2.5 Gbps using four differential LVDS lanes). This increase in the data rate far exceeds the data rate of existing systems in currently available vehicles. For example, the standard for multimedia and infotainment networking in vehicles, i.e., media oriented systems transport bus (MOST) has a data transfer rate of 150 Mbps.

Some solutions for providing high-speed interconnects include electrical interconnects and optical interconnects. However, both suffer significant drawbacks when used in the automotive industry. Electrical connections, such as ethernet, may be utilized by employing multiple lanes (i.e., cables) to reach the required bandwidth. However, this becomes increasingly expensive and power hungry to support the required data rates for short to intermediate (e.g., 5 m-10 m) interconnects needed in the automotive industry. For example, to extend the length of a cable or the given bandwidth on a cable, higher quality cables may need to be used or advanced equalization, modulation, and/or data correction techniques employed. Unfortunately, these solutions require additional power and increase the latency of the system. Latency increases are particularly problematic in autonomous vehicles due to the need to make rapid decisions (e.g., braking, avoidance maneuvers, drive train corrections, etc.) needed to ensure the safety of passengers within the vehicle and/or persons and/or property external to the vehicle.

Optical transmission over fiber is capable of supporting the required data rates and distances needed for autonomous and/or self-driving vehicles. However, the use of optical connections results in a severe power and cost penalty, especially for short to medium distances (e.g., 5 m-10 m) because of the need for conversion between optical and electrical signals. Furthermore, the alignment of optical interconnects needs to be precisely maintained. As noted above, this proves to be a difficult challenge in automotive applications due to vibrations and other environmental conditions that may alter the alignment of the optical interconnects, and therefore, reduces the reliability of optical interconnects.

Accordingly, both technologies (traditional electrical and optical) are not optimal for autonomous and/or self-driving vehicles that require highly reliable interconnect lines between peripheral components and the ECU while still providing high data-rates, low latencies, and low power consumption.

DETAILED DESCRIPTION OF THE INVENTION

Described herein are systems that include mm-wave interconnects and connectors that are used in autonomous and/or self-driving vehicles, according to embodiments of the invention. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, currently available interconnect solutions (i.e., electrical cables and optical cables) do not satisfy data rate, power consumption, latency, and cost targets needed for autonomous and/or self-driving vehicles (e.g., cars, trucks, trains, boats, planes, and any other autonomous transportation/cargo vehicle). Accordingly, embodiments of the invention include millimeter-wave waveguide (mm-wave waveguide) interconnect solutions. In an embodiment, the mm-wave waveguide comprises a dielectric waveguide bundle that is made out of low loss coated or uncoated dielectric materials designed to operate in the mm-wave or sub-THz frequency range. The waveguides may be coupled at both ends to a package that includes a mm-wave engine. In short to medium length cables (e.g., 0.5-15 meters), the mm-waveguide cables provide a low power, low latency, high-speed, and low cost solution. Particularly, since signals do not need to be up-converted to an optical signal, the power consumption is significantly lower than the power consumption of the alternative optical fiber interconnect technology. Additionally, in the short to medium length cables, there may be no need for error correction (EC), since achieved bit-error-rate level rates are very low (e.g., below 10E-12).Therefore, the achieved latency may be significantly lower compared to the traditional electrical interconnects, especially at high data rates where EC is needed.

However, as noted above, the mm-waveguide cables need to interface with the ECU and peripheral sensors in a manner that also satisfies stringent environmental requirements in the automotive industry. For example, the enclosures surrounding the ECU and peripheral components may need to be dust and moisture proof. Additionally, the connectors may need to minimize the effects of vibration in order to ensure proper alignment of the interconnects. Accordingly, embodiments include connectors with alignment features in order to provide connections for the mm-wave waveguides that are properly aligned while also meeting environmental requirements of the automotive industry.

Figure 2:
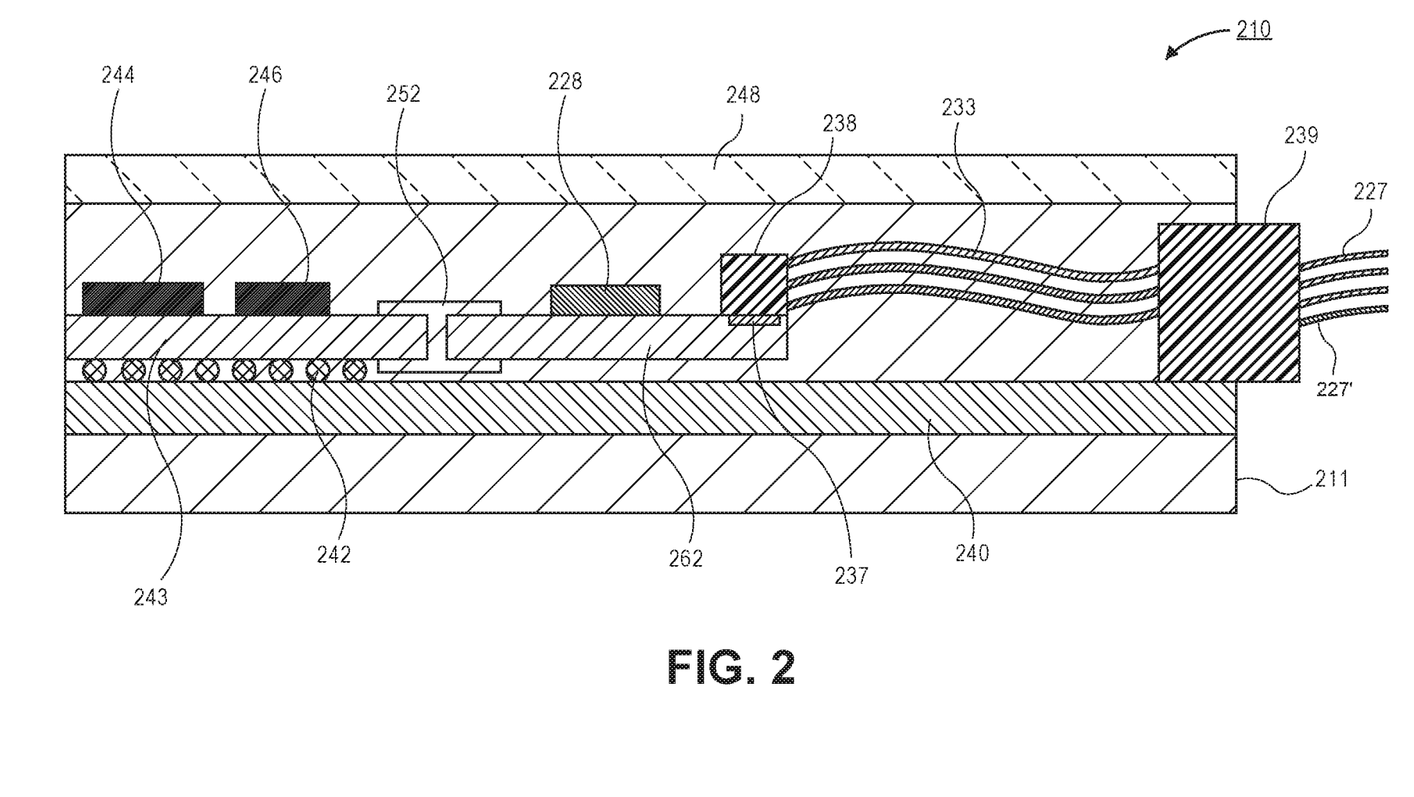
FIG. 2 is a cross-sectional illustration of an ECU that includes a mm-wave engine attached inside the ECU and coupled to a waveguide connector at the edge of the ECU, according to an embodiment of the invention.

Referring now to FIG. 2, a cross-sectional illustration of an ECU 210 that includes an external connector 239 is shown, according to an embodiment of the invention. It is to be appreciated that the ECU 210 shown is exemplary in nature, and any configuration that includes connectors 239 such as those described herein may be used. Furthermore, embodiments of the invention are not limited to connectors 239 integrated with an ECU 210. For example, substantially similar connectors 239 may be utilized in conjunction with sensors or other components in an autonomous and/or self-driving vehicle that communicate with the ECU 210. Additionally, while the connectors at one end of the dielectric waveguides are shown in the figures, it is to be appreciated that the second end of the dielectric waveguides may be coupled to connectors that are substantially similar to those described herein.

In an embodiment, the ECU 210 may be enclosed within an ECU enclosure 211. The ECU enclosure 211 protects the electrical components (described in greater detail below) from environmental conditions, such as dust, moisture, or the like. However, in order to allow for a mm-wave signal to be transmitted or received from the ECU 210, a connection through the wall needs to be made. While allowing for a communication pathway through the ECU enclosure 211, the connection still needs to maintain the protections against the environmental conditions. In the embodiment illustrated in FIG. 2, the connector 239 is shown in a generic embodiment that depicts the junction between external dielectric waveguides 227 and internal dielectric waveguides 223 in order to not obscure the description and illustration of the electrical components used for the ECU. Detailed descriptions and illustrations of connectors 239 according to various embodiments of the invention are provided below.

In an embodiment, the dielectric waveguides 223, 227 are formed with materials suitable for propagating mm-wave signals. The dielectric waveguides 223, 227 may be any suitable dielectric material, such as liquid crystal polymer (LCP), low-temperature co-fired ceramic (LTCC), glass, polytetrafluoroethylene (PTFE), expanded PTFE, low-density PTFE, ethylene tetrafluoroethylene (ETFE), fluorinated ethylene propylene (FEP), polyether ether ketone (PEEK), perfluoroalkoxy alkanes (PFA), combinations thereof, or the like. In an embodiment, the dielectric waveguides may have any shaped cross section, including, but not limited to, rectangular (with or without rounded corners), square, circular, oval, among others. In an embodiment, the dielectric waveguides 227 may also include a metallic coating (not shown) to provide electrical shielding to the dielectric waveguide. In some embodiments, the metallic coating of a dielectric waveguide may be used as a power line. For example, power may be applied on a shield along dielectric waveguide 227'. While a single dielectric waveguide is shown as carrying a powerline, it is to be appreciated that any number of the dielectric waveguides (e.g., from zero to all) of the dielectric waveguides 227 may be used to support powerlines. As described in greater detail below, powerlines 227' may also pass through the connector 239. Furthermore, while power may be applied on a shield along a dielectric waveguide, it is to be appreciated that copper lines may also be bundled in the same bundle as dielectric waveguides in order to support power along the length of the dielectric waveguide. Accordingly, references to powerlines 227' within this application may refer to a powerlines over dielectric waveguides and or copper powerlines.

In some embodiments a heatsink 248 or any other thermal management technology may also be included in the ECU 210. For example, the heatsink 248 may be a liquid cooled heatsink 248, such as one that is connected to the cooling systems in the autonomous vehicle. In the illustrated embodiment, the heatsink 248 is formed over a surface of an ECU enclosure 211. However, the heatsink 248 may be within the ECU enclosure 211 in some embodiments of the invention.

In an embodiment, the ECU 210 may include a central processing unit (CPU) die 244 that is packaged on a packaging substrate 243. The packaging substrate 243 may be coupled to an ECU printed circuit board (PCB) 240 by solder bumps 242, such as a ball grid array (BGA), a land grid array (LGA), a socket, or any other known interconnect. In some embodiments, a predefined digital interconnect interface die 246 electrically coupled between CPU die 244 and the mm-wave engine 228 may also be packaged on the same packaging substrate 243 on which the CPU die 244 is packaged. For example, the predefined digital interconnect interface die 246 may translate and/or condition a signal so that signals may pass between the CPU die 244 and a mm-wave engine 228 even when the output of either of the CPU die 244 or the mm-wave engine 228 does not match the type of input expected by the other component.

In an embodiment, the mm-wave engine 228 may be packaged on a mm-wave packaging substrate 262. The mm-wave packaging substrate 262 may be coupled to the CPU packaging substrate 243 by a predefined digital interface 252. In the illustrated embodiment, the mm-wave packaging substrate 262 is only supported by the predefined digital interface 252, however it is to be appreciated that additional mechanical supports (not shown) may also be used to provide improved mechanical reliability to the system. As such, the mm-wave packaging substrate 262 is independent of the CPU organic packaging substrate 243, and allows for the use of mm-wave appropriate substrates and stack ups. This may enable better performance of the mm-wave system compared to direct integration of the mm-wave engine 228 with the CPU package 243. However, it is to be appreciated that embodiments of the invention also include packaging the mm-wave engine 228 at any location, including on the CPU organic packaging substrate 243, on the PCB 240, and outside of the ECU 210.

According to an embodiment, the mm-wave engine 228 may include a power supply and management die. Additional embodiments may include a modulator die and a demodulator die. In some embodiments, the modulator die and the demodulator die may be integrated on a single die. Embodiments may also include a mm-wave transmitter (Tx) die and a mm-wave receiver (Rx) die. In some embodiments the Tx die and the Rx die may be integrated on a single die. Additional embodiments may also include any number of components being integrated on a single die. In another embodiment, the mm-wave engine 228 may be a transmitting mm-wave engine or a receiving mm-wave engine. In such embodiments, the transmitting mm-wave engine may include a Tx die and a modulator die and the receiving mm-wave engine may include an Rx die and a demodulator die. The components may also be formed on any suitable semiconductor material. For example, the dies may be silicon dies, III-V material dies, silicon on insulator (SOI) dies, III-V materials integrated on a single die with silicon, silicon germanium (SiGe) dies, or any other combination of semiconductor materials.

In an embodiment, a launcher 237 may be used to launch and assist the propagation of the mm-wave signal along the dielectric waveguide 223 or a bundle of dielectric waveguides 223 (e.g., two or more dielectric waveguides separated by air, another dielectric material, or metal). In some embodiments, the launcher 237 may be integrated with a waveguide connector 238 that mechanically and communicatively couples the dielectric waveguide 223 to the launcher 237. The launcher 237 may be any known launcher for initiating the propagation of mm-waves or receiving mm-waves, such as regular single patch launcher, a stacked-patch launcher, a microstrip-to-tapered slot transition launcher, etc. While illustrated as being located on a top surface of the mm-wave packaging substrate 262, it is to be appreciated that the waveguide connector 238 and the launcher 237 may be formed at any location, including the bottom surface of the mm-wave packaging substrate 262 or embedded within the mm-wave packaging substrate 262. In an additional embodiment, the waveguide connector 238 and/or the launcher 237 may be overmolded.

Figure 3A:
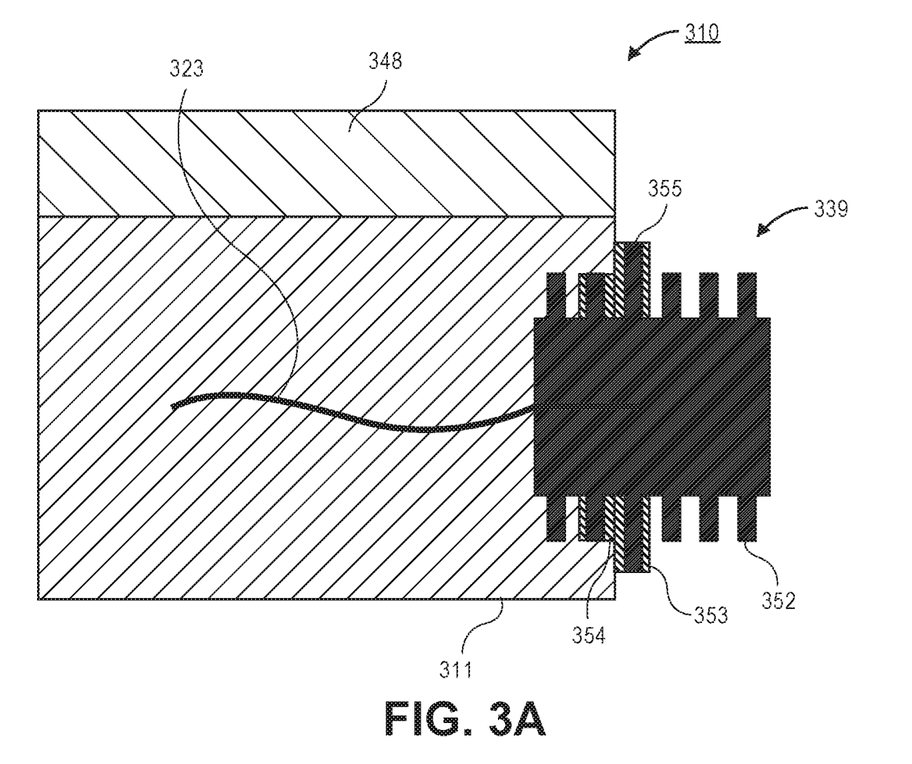
FIG. 3A is a cross-sectional illustration of a portion of an ECU that includes a waveguide connector at the edge of the ECU, according to an embodiment of the invention.

Referring now to FIG. 3A, a cross-sectional schematic of a portion of an ECU 310 is shown, according to an embodiment. In the illustrated embodiment, the connector 339 is shown in greater detail and the electrical components in the ECU are omitted in order to not obscure embodiments of the invention. In an embodiment, the connector 339 will extend from an internal portion of the ECU enclosure 311 to an external portion of the ECU enclosure 311 (i.e., the connector 339 may pass through a wall of the ECU enclosure 311. The internal dielectric waveguide 323 may pass through an opening in the connector 339. In one embodiment, the connector 339 may include threads 352 that allow for the connector 339 to be screwed into the ECU enclosure 339. In an embodiment, the connector 339 may also include a stop ring 355. The stop ring 355 may be used to ensure the connector is set into the ECU enclosure 311 at the proper position.

In an embodiment, a gasket 353 may also be used to ensure the ECU enclosure 311 remains sealed from outside environmental elements. The gasket 353 may contact the ECU enclosure 311 and wrap around a portion of the connector 339. The stop ring 355 may compress the gasket 353 against the external surface of the ECU enclosure 311. In some embodiments, a second gasket 354 may be located on the interior surface of the ECU enclosure 311. In the illustrated embodiment, both the first gasket 353 on the exterior of the ECU enclosure 311 and the second gasket 354 on the interior of the ECU enclosure 311 are shown. However, embodiments may also include only the first gasket 353 or the second gasket 354.

Figure 3B:
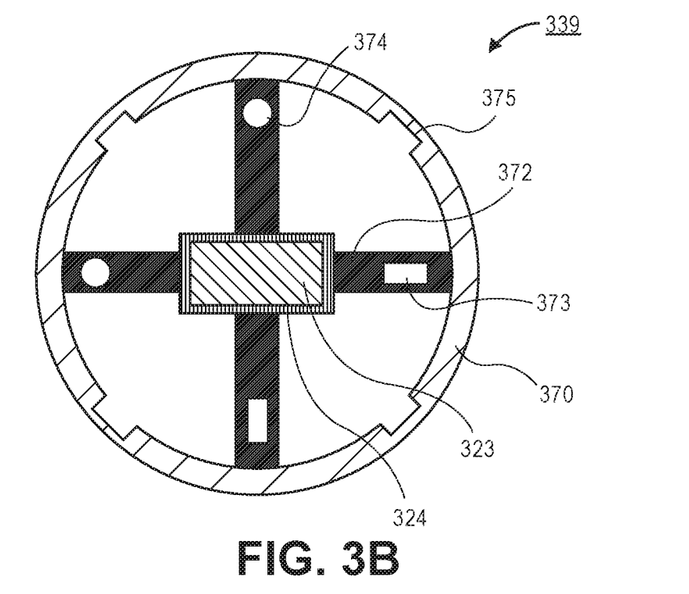
FIG. 3B is a cross-sectional illustration of the connector that illustrates alignment features and posts for supporting the dielectric waveguide, according to an embodiment of the invention.

Referring now to FIG. 3B, an illustration of the connector 339 that shows the cross-section of the internal dielectric waveguide 323 is shown, according to an embodiment of the invention. In an embodiment, the internal dielectric waveguide 323 is shown as having a conductive covering 324. In alternative embodiments, the internal dielectric waveguide 323 may not have a conductive covering 324. According to an embodiment, the dielectric waveguide 323 may be held in the opening through the connector by one or more posts 372 that extend out from the outer ring 370 of the connector 339. In the illustrated embodiment, there are four posts that secure the dielectric waveguide 323 in substantially the center of the connector 339. In alternative embodiments, any number of posts 372 may be used. Furthermore, embodiments may include any number of dielectric waveguides 323 being suspended in the center of the connector 339. For example, a bundle of two or more dielectric waveguides 323 may be suspended in the center of the connector 339 by the posts 372.

In addition to securing the dielectric waveguide 323, the posts 372 may include alignment features 373, 374. The alignment features 373, 374 may have any desired shape that interfaces with an external connector used for the external dielectric waveguides (not shown). In some embodiments, the alignment features 373, 374 may be keyed in order to ensure proper alignment. For example, first alignment features 373 may be a different shape than second alignment features 374. In the illustrated embodiment, the alignment features 373 are rectangular in shape, and the alignment features 374 are circular in shape. However, it is to be appreciated that any combination of shapes or different sizes of the same shape may be used to provide keying for the connector 339. Accordingly, the external connector will only be able to couple to the connector 339 when in the proper orientation. In yet another embodiment, the outer ring 370 of the connector may have one or more notches 375. The notches 375 may further improve alignment with an external connector (not shown). Embodiments of the invention may include any number of notches.

Figure 4A:
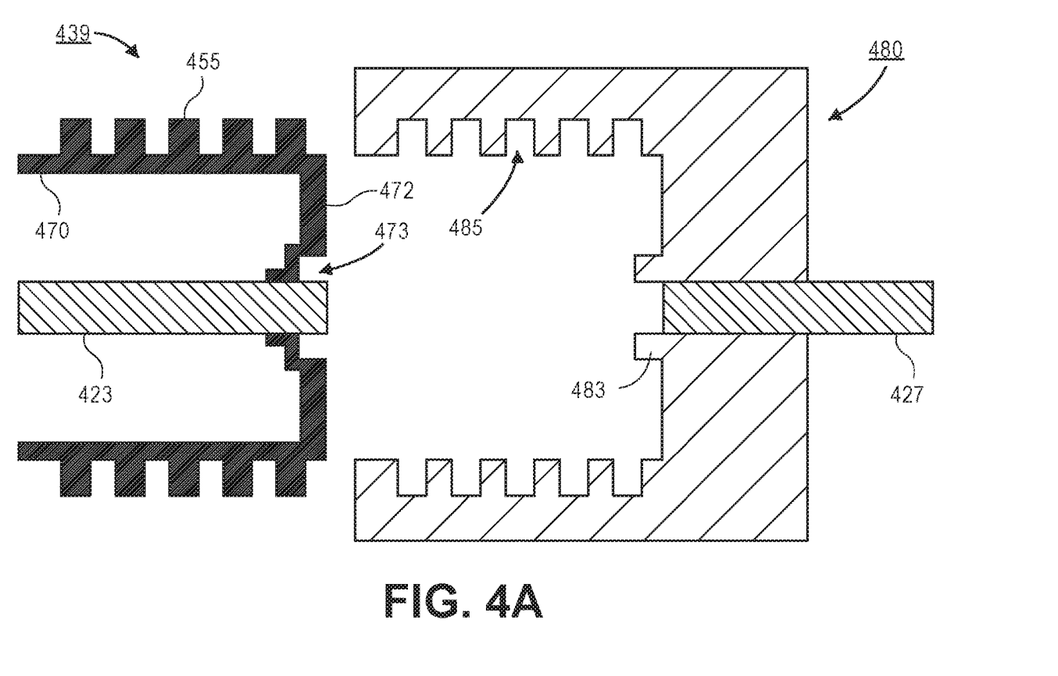
FIG. 4A is a cross-sectional illustration of male and female portions of a connector prior to being coupled together, according to an embodiment of the invention.

Referring now to FIG. 4A, a cross-sectional illustration of a male connector 439 and a female connector 480 prior to being coupled together are shown, according to an embodiment of the invention. In the illustrated embodiment, the male connector 439 may pass through the ECU enclosure (not shown) and the female connector 480 may be the external connector. However, it is to be appreciated that embodiments may also include a female connector that passes through the ECU enclosure 411 and the external connector may be a male connector.

According to an embodiment the male connector 439 may include threads 455 formed on the outer ring 470. The male connector 439 may also include one or more posts 472 that secure the internal dielectric waveguide 423. In an embodiment, the posts 472 may include alignment features 473. In the illustrated embodiment, the alignment features 473 are formed proximate to the dielectric waveguide 423, though embodiments are not limited to such configurations. For example, the alignment features 473 may be formed along any portion of the posts 472.

In an embodiment, the female connector 480 may include a reverse threading 485 configured to mate with the threads 455 on the male connector. The female connector 480 may also include an opening through which the external dielectric waveguide 427 passes. In an embodiment, the female connector 480 may include alignment features 483 that are configured to mate with the alignment features 473 in the male connector 439.

Figure 4B:
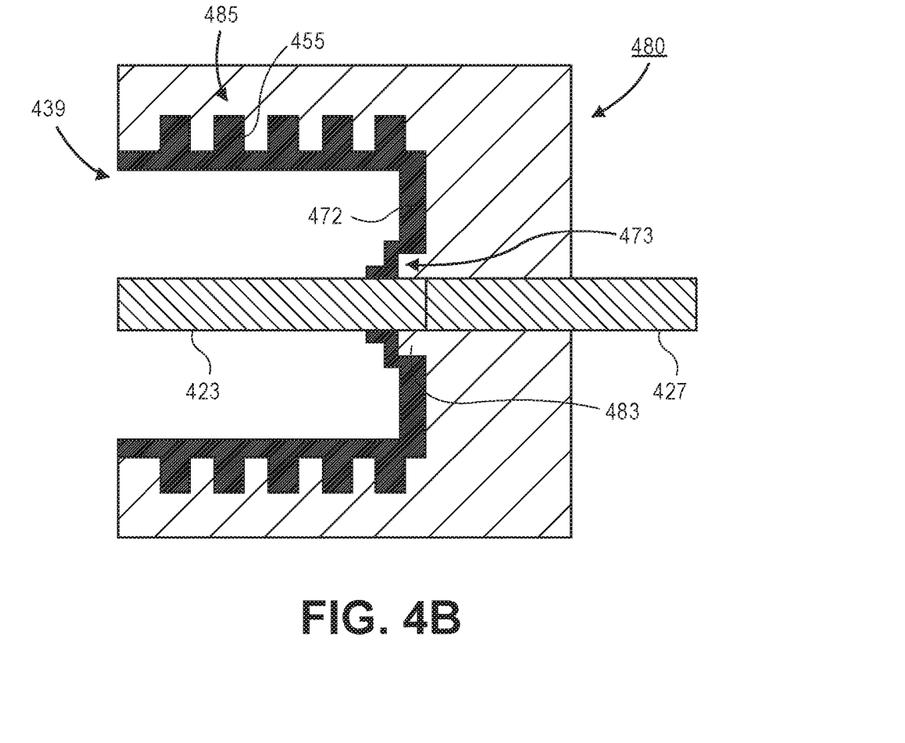
FIG. 4B is a cross-sectional illustration of male and female portions of a connector after they have been coupled together, according to an embodiment of the invention.

Referring now to FIG. 4B, a cross-sectional illustration of the female connector 480 coupled to the male connector 439 is shown, according to an embodiment of the invention. As illustrated, the alignment features 473 of the male connector 439 mate with the alignment features 483 of the female connector 480. According to an embodiment, the alignment features 483, 473 line up such that the internal dielectric waveguide 423 is substantially flush and aligned with the external dielectric waveguide 437. As used herein, aligned dielectric waveguides refer to waveguides that are positioned so that the end faces of each dielectric waveguide have substantially matching longitudinal centerlines. In the illustrated embodiment, the posts 472 in the male connector 439 are contacting a surface of the female connector 480. In additional embodiments of the invention, the posts 472 of the male connector 439 may not contact a surface of the female connector 480. According to an embodiment, the female connector 480 may also seal the opening formed through the male connector 439. Accordingly, the ECU enclosure may be substantially sealed and protected from environmental conditions.

Such embodiments that include a male connector 439 and a female connector 480 with an internal dielectric waveguide 423 and an external dielectric waveguide 427 allow for simple replacement of the external dielectric waveguide 427 if needed. For example, if the external dielectric waveguide 427 is damaged or otherwise needs to be replaced, the female connector 480 may be removed without needing to access the interior of the ECU enclosure.

While the male and female connectors allow for the alignment of the external and internal dielectric waveguides to be precise and allow for simple repair, it is to be appreciated that a junction between the two dielectric waveguides may result in losses due to signal reflections and insertion losses. Accordingly, embodiments of the invention may also include male and female connectors that utilize a single dielectric waveguide.

Figure 4C:
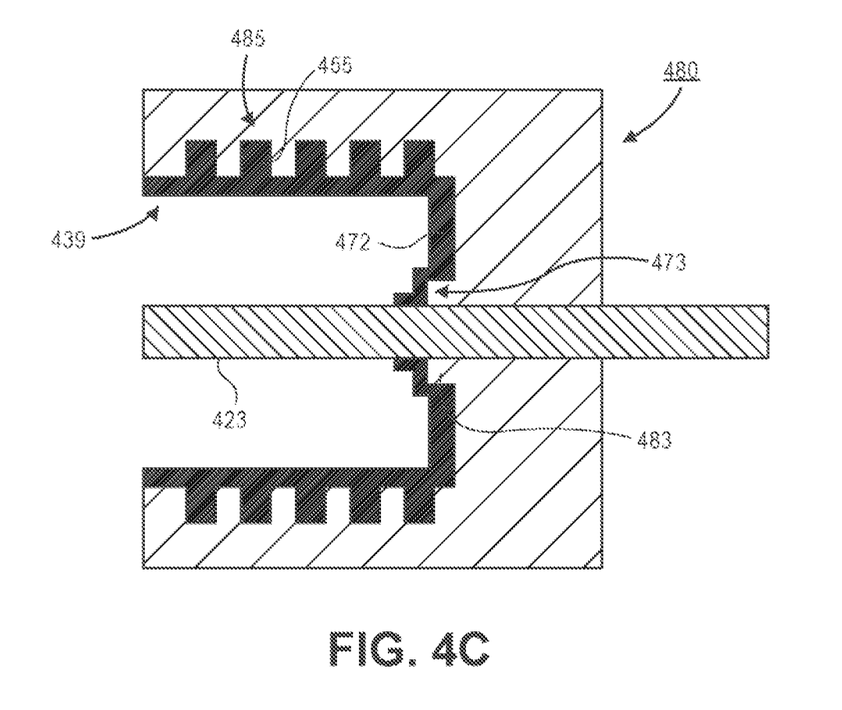
FIG. 4C is a cross-sectional illustration of male and female portions of a connector that includes a single dielectric waveguide, according to an embodiment of the invention.

Referring now to FIG. 4C, a cross-sectional illustration of male and female connectors that utilize a single dielectric waveguide 423 is shown, according to an embodiment. In such embodiments, a single dielectric waveguide 423 may pass through both the male connector 439 and the female connector 480. In such embodiments, the alignment at the junction between the two connectors is not an issue since a single dielectric waveguide 423 is used. Furthermore, since there are no junctions between dielectric materials, losses are reduced. However, it is to be appreciated that replacing the dielectric waveguide may be more burdensome since there is a need to access the interior of the ECU enclosure.

In yet another embodiment of the invention, no connectors may pass through the sidewall of the ECU enclosure. In such embodiments, the ECU may have no need for any openings. As such, the ECU is even further protected from environmental conditions. In order to form an ECU enclosure without openings formed for the dielectric waveguides, a third dielectric waveguide may be embedded directly into the wall of the ECU. A cross-sectional illustration of a wall of the ECU enclosure 511 according to such an embodiment is shown in FIG. 5A.

Figure 5A:
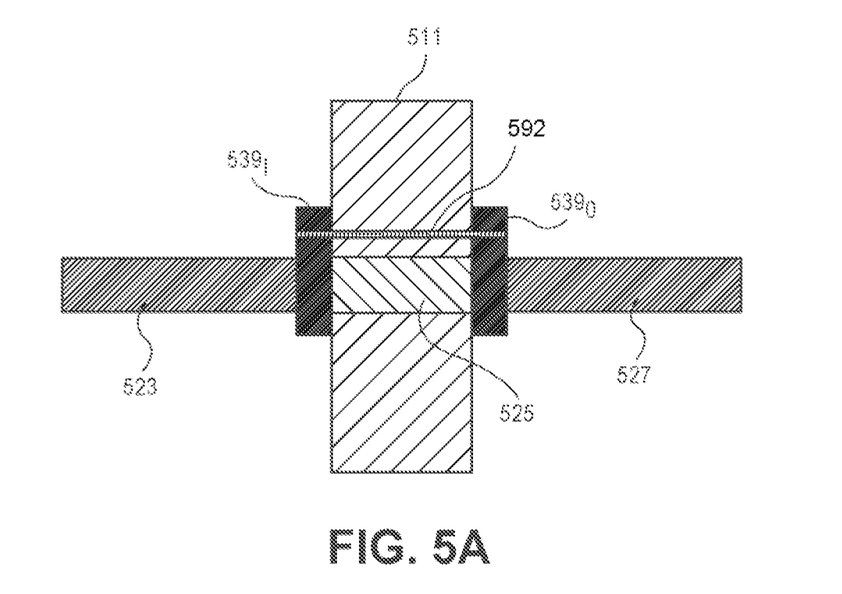
FIG. 5A is a cross-sectional illustration of a connector that includes dielectric waveguide that is embedded within a wall of the ECU enclosure, according to an embodiment of the invention.

As illustrated in FIG. 5A, the internal dielectric waveguide 523 may extend to the interior surface of the ECU enclosure 511 and the external dielectric waveguide 527 may extend to the exterior surface of the ECU enclosure 511. In an embodiment, the internal dielectric waveguide 523 may be secured to the interior surface of the ECU enclosure 511 by an interior connector $539_I$ and the external dielectric waveguide 527 may be secured to the exterior surface of the ECU enclosure 511 by an exterior connector $539_O$. In an embodiment, the interior and exterior connectors $539_I$, $539_O$ may be any suitable connectors that secure the dielectric waveguides to the surfaces of the ECU enclosure 511. For example, the connectors may include threading that couples to the surface of the ECU enclosure 511. Additionally, the connectors may include alignment features or notches 573 (illustrated in FIG. 5B) substantially similar to those described above.

As illustrated, the interior dielectric waveguide 523 and the exterior dielectric waveguide 527 may be positioned so that they align with a third dielectric waveguide 525. In an embodiment, the third dielectric waveguide is embedded within the wall of the ECU enclosure 511. The internal face of the third dielectric waveguide 525 may be substantially coplanar with the interior wall of the enclosure 511 and the external face of the third dielectric waveguide 525 may be substantially coplanar with the exterior wall of the enclosure 511. For example, the third dielectric waveguide 525 may be press fitted into an opening that is fabricated into the ECU enclosure 511. By press fitting the third dielectric waveguide 525 into the opening, the ECU enclosure 511 remains substantially sealed. In some embodiments, the third dielectric waveguide 525 may be air. In such embodiments, the external and internal connectors may be used to seal the ECU enclosure 511.

Figure 5B:
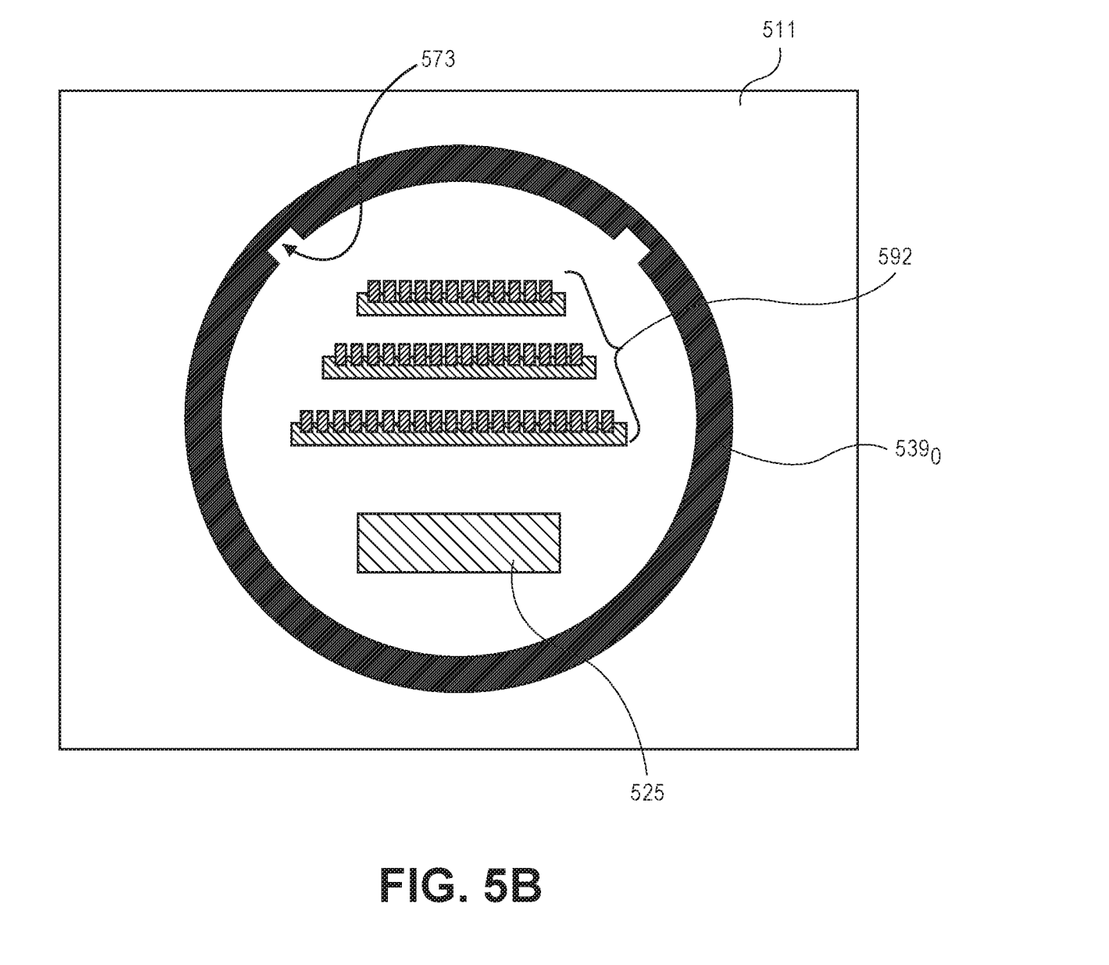
FIG. 5B is a cross-sectional illustration of a connector that includes a dielectric waveguide that is embedded within a wall of the ECU enclosure and a plurality of pins that are coupled to a power line that passes through the wall of the ECU enclosure, according to an embodiment of the invention.

In such embodiments, it may not be possible to pass a powerline through the dielectric waveguides. As such, embodiments may also include a power line 592 (e.g., a copper line, an ethernet line, etc.) that passes through the wall of the ECU enclosure 511. As illustrated in FIG. 5B, the power line 592 may include standard pin connections or any other electrical connections at the connectors 539.

Figure 6:
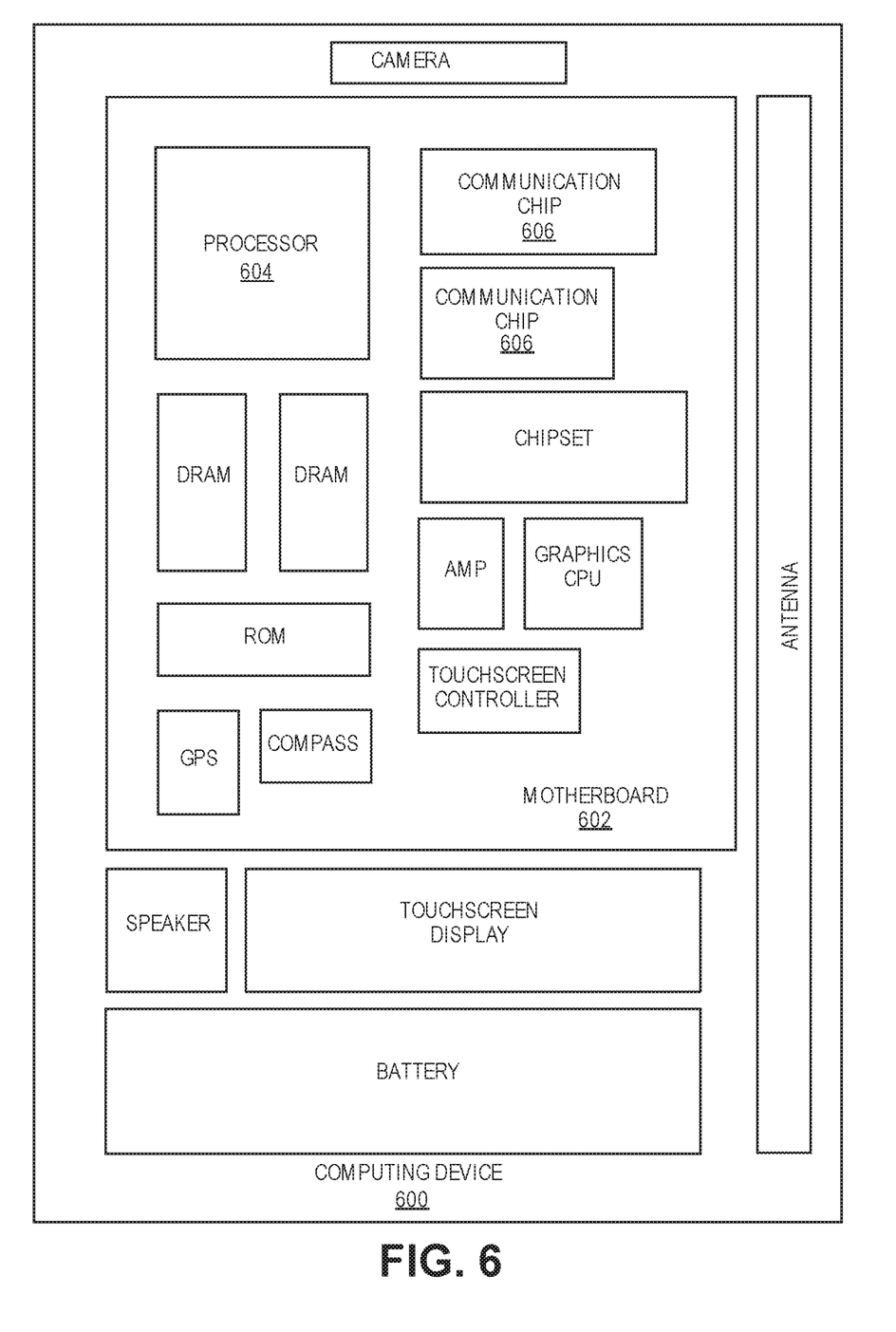
FIG. 6 is a schematic of a computing device built in accordance with an embodiment of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604. In yet another implementation, the communication chip 706 may function as a predefined interface (e.g., a serializer/deserializer, or the like).

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor may be packaged on an organic substrate and provide signals that are converted to a mm-wave signal and propagated along a mm-wave interconnect, in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip may be packaged on an organic substrate and provide signals that are converted to a mm-wave signal and propagated along a mm-wave interconnect, in accordance with implementations of the invention.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a dielectric waveguide connector, comprising: an outer ring; one or more posts extending from the outer ring towards the center of the outer ring; and a first dielectric waveguide secured within the dielectric ring by the one or more posts.

Example 2: the dielectric waveguide connector of Example 1, wherein an alignment feature is formed on one or more of the posts.

Example 3: the dielectric waveguide connector of Example 1 or Example 2, wherein a first alignment feature is formed on a first post, and wherein a second alignment feature is formed on a second post.

Example 4: the dielectric waveguide connector of Example 1, Example 2, or Example 3, wherein the first alignment feature is a different shape than the second alignment feature.

Example 5: the dielectric waveguide connector of Example 1, Example 2, Example 3, or Example 4, further comprising one or more notches formed into the interior surface of the outer ring.

Example 6: the dielectric waveguide connector of Example 1, Example 2, Example 3, Example 4, or Example 5, wherein an outer surface of the outer ring is threaded.

Example 7: the dielectric waveguide connector of Example 1, Example 2, Example 3, Example 4, Example 5, or Example 6, further comprising a stop ring formed around an outer surface of the outer ring.

Example 8: the dielectric waveguide connector of Example 1, Example 2, Example 3, Example 4, Example 5, Example 6, or Example7, further comprising a female portion of the connector, wherein the female portion of the connector comprises: a threaded surface that is coupled to the threaded surface of the outer ring; one or more alignment features that are each coupled with a corresponding one of the alignment features on the one or more posts; and a second dielectric waveguide passing through the female portion of the connector.

Example 9: the dielectric waveguide connector of Example 1, Example 2, Example 3, Example 4, Example 5, Example 6, Example 7, or Example 8, wherein the first dielectric waveguide is aligned with the second dielectric waveguide.

Example 10: the dielectric waveguide connector of Example 1, Example 2, Example 3, Example 4, Example 5, Example 6, Example 7, Example 8, or Example 9, wherein the outer ring passes through a wall of an enclosure.

Example 11: the dielectric waveguide connector of Example 1, Example 2, Example 3, Example 4, Example 5, Example 6, Example 7, Example 8, Example 9, or Example 10, further comprising a gasket contacting the surface of the wall of the enclosure and surrounding the outer ring.

Example 12: the dielectric waveguide connector of Example 1, Example 2, Example 3, Example 4, Example 5, Example 6, Example 7, Example 8, Example 9, Example 10, or Example 11, wherein the enclosure is an enclosure for an electronic control unit (ECU).

Example 13: the dielectric waveguide connector of Example 1, Example 2, Example 3, Example 4, Example 5, Example 6, Example 7, Example 8, Example 9, Example 10, Example 11, or Example 12, wherein the enclosure is an enclosure for a sensor.

Example 14: the dielectric waveguide connector of Example 1, Example 2, Example 3, Example 4, Example 5, Example 6, Example 7, Example 8, Example 9, Example 10, Example 11, Example 12, or Example 13, wherein a conductive coating is formed around the dielectric waveguide.

Example 15: the dielectric waveguide connector of Example 1, Example 2, Example 3, Example 4, Example 5, Example 6, Example 7, Example 8, Example 9, Example 10, Example 11, Example 12, Example 13, or Example 14, wherein the first and second dielectric wave guides are formed from one or more of liquid crystal polymer (LCP), low-temperature co-fired ceramic (LTCC), glass, polytetrafluoroethylene (PTFE), expanded PTFE, low-density PTFE, ethylene tetrafluoroethylene (ETFE), fluorinated ethylene propylene (FEP), polyether ether ketone (PEEK), or perfluoroalkoxy alkanes (PFA).

Example 16: an enclosure surrounding electronic components, comprising: an enclosure wall having an interior surface and an exterior surface; and a dielectric waveguide embedded within the enclosure wall, wherein a first end of the dielectric waveguide is substantially coplanar with the interior surface of the enclosure wall and a second end of the dielectric waveguide is substantially coplanar with the exterior surface of the enclosure wall.

Example 17: the enclosure of Example 16, further comprising: an interior connector coupled to the interior surface of the enclosure wall, wherein the interior connector includes an interior dielectric waveguide, and wherein the interior dielectric waveguide is aligned with the first end of the dielectric waveguide embedded within the enclosure wall; and an exterior connector coupled to the exterior surface of the enclosure wall, wherein the exterior connector includes an exterior dielectric waveguide, and wherein the exterior dielectric waveguide is aligned with the second end of the dielectric waveguide.

Example 18: the enclosure of Example 16 or Example 17, further comprising: a power line passing through the enclosure wall, wherein the powerline is electrically coupled to a pin connector in the exterior connector and/or the interior connector.

Example 19: the enclosure of Example 16, Example 17, or Example 18, wherein the dielectric waveguide embedded in the enclosure wall is the same material as the interior dielectric waveguide and/or the exterior dielectric waveguide.

Example 20: the enclosure of Example 16, Example 17, Example 18, or Example 19, wherein the dielectric waveguide embedded in the enclosure wall is air.

Example 21: the enclosure of Example 16, Example 17, Example 18, Example 19, or Example 20, wherein the interior connector and the exterior connector each comprise alignment features.

Example 22: the enclosure of Example 16, Example 17, Example 18, Example 19, Example 20, or Example 21, wherein the electronic components are an electronic control unit (ECU).

Example 23: the enclosure of Example 16, Example 17, Example 18, Example 19, Example 20, Example 21, or Example 23, wherein the electronic components are a sensor.

Example 24: an electronic control unit (ECU), comprising: an ECU enclosure; a printed circuit board (PCB) within the ECU enclosure; a central processing unit (CPU) die packaged on a CPU packaging substrate, wherein the CPU packaging substrate is electrically coupled to the PCB; a mm-wave engine packaged on a mm-wave engine packaging substrate, wherein the mm-wave engine packaging substrate is coupled to the CPU packaging substrate with a predefined interface; a dielectric waveguide connector formed through a wall of the ECU enclosure, wherein the dielectric waveguide connector, comprises: an outer ring, wherein the outer ring is threaded; one or more posts extending from the outer ring towards the center of the outer ring, wherein an alignment feature is formed on one or more of the posts; and an interior dielectric waveguide wherein a first end of the dielectric waveguide is secured within the dielectric ring by the one or more posts, and wherein a second end of the interior dielectric wave is coupled to the mm-wave engine.

Example 25: the ECU of Example 24, further comprising a female portion of the connector, wherein the female portion of the connector comprises: a threaded surface that is coupled to the threaded surface of the outer ring; one or more alignment features that are each coupled with a corresponding one of the alignment features on the one or more posts; and an exterior dielectric waveguide passing through the female portion of the connector and aligned with the interior dielectric waveguide.

What is claimed is:
1. A dielectric waveguide connector, comprising:
   an outer ring;
   one or more posts extending from the outer ring towards the center of the outer ring; and
   a first dielectric waveguide secured within the outer ring by the one or more posts, wherein a conductive coating is formed around the first dielectric waveguide.

2. The dielectric waveguide connector of claim 1, further comprising one or more notches formed into an interior surface of the outer ring.

3. The dielectric waveguide connector of claim 1, wherein an alignment feature is formed on one or more of the posts.

4. The dielectric waveguide connector of claim 3, wherein the alignment feature includes a first alignment feature is formed on a first post, and wherein a second alignment feature is formed on a second post.

5. The dielectric waveguide connector of claim 4, wherein the first alignment feature is a different shape than the second alignment feature.

6. The dielectric waveguide connector of claim 1, wherein an outer surface of the outer ring is threaded.

7. The dielectric waveguide connector of claim 6, further comprising a stop ring formed around the outer surface of the outer ring.

8. The dielectric waveguide connector of claim 6, further comprising a female portion of the connector, wherein the female portion of the connector comprises:
- a threaded surface that is coupled to the threaded surface of the outer ring;
- one or more alignment features that are each coupled with a corresponding alignment feature on the one or more posts; and
- a second dielectric waveguide passing through the female portion of the connector.

9. The dielectric waveguide connector of claim 8, wherein the first dielectric waveguide is aligned with the second dielectric waveguide.

10. The dielectric waveguide connector of claim 9, wherein the outer ring passes through a wall of an enclosure.

11. The dielectric waveguide connector of claim 10, further comprising a gasket contacting the surface of the wall of the enclosure and surrounding the outer ring.

12. The dielectric waveguide connector of claim 10, wherein the enclosure is an enclosure for an electronic control unit (ECU).

13. The dielectric waveguide connector of claim 10, wherein the enclosure is an enclosure for a sensor.

14. The dielectric waveguide connector of claim 1, wherein the first waveguide is formed from one or more of liquid crystal polymer (LCP), low-temperature co-fired ceramic (LTCC), glass, polytetrafluoroethylene (PTFE), expanded PTFE, low-density PTFE, ethylene tetrafluoroethylene (ETFE), fluorinated ethylene propylene (FEP), polyether ether ketone (PEEK), or perfluoroalkoxy alkanes (PFA).

15. A dielectric waveguide connector, comprising:
- an outer ring;
- one or more posts extending from the outer ring towards the center of the outer ring, wherein an alignment feature is formed on one or more of the posts; and
- a first dielectric waveguide secured within the outer ring by the one or more posts.

16. An enclosure surrounding electronic components, comprising:
- an enclosure wall having an interior surface and an exterior surface; and
- a dielectric waveguide embedded within the enclosure wall, wherein a first end of the dielectric waveguide is substantially coplanar with the interior surface of the enclosure wall and a second end of the dielectric waveguide is substantially coplanar with the exterior surface of the enclosure wall.

17. The enclosure of claim 16, wherein the electronic components are an electronic control unit (ECU).

18. The enclosure of claim 16, wherein the electronic components are a sensor.

19. The enclosure of claim 16, further comprising:
- an interior connector coupled to the interior surface of the enclosure wall, wherein the interior connector includes an interior dielectric waveguide, and wherein the interior dielectric waveguide is aligned with the first end of the dielectric waveguide embedded within the enclosure wall; and
- an exterior connector coupled to the exterior surface of the enclosure wall, wherein the exterior connector includes an exterior dielectric waveguide, and wherein the exterior dielectric waveguide is aligned with the second end of the dielectric waveguide.

20. The enclosure of claim 19, further comprising:
- a power line passing through the enclosure wall, wherein the powerline is electrically coupled to a pin connector in the exterior connector and/or the interior connector.

21. The enclosure of claim 19, wherein the dielectric waveguide embedded in the enclosure wall is the same material as the interior dielectric waveguide and/or the exterior dielectric waveguide.

22. The enclosure of claim 19, wherein the dielectric waveguide embedded in the enclosure wall is air.

23. The enclosure of claim 19, wherein the interior connector and the exterior connector each comprise alignment features.

24. An electronic control unit (ECU), comprising:
- an ECU enclosure;
- a printed circuit board (PCB) within the ECU enclosure;
- a central processing unit (CPU) die packaged on a CPU packaging substrate, wherein the CPU packaging substrate is electrically coupled to the PCB;
- a mm-wave engine packaged on a mm-wave engine packaging substrate, wherein the mm-wave engine packaging substrate is coupled to the CPU packaging substrate with a predefined interface;
- a dielectric waveguide connector formed through a wall of the ECU enclosure, wherein the dielectric waveguide connector, comprises:
  - an outer ring, wherein the outer ring is threaded;
  - one or more posts extending from the outer ring towards the center of the outer ring, wherein an alignment feature is formed on one or more of the posts; and
- an interior dielectric waveguide wherein a first end of the dielectric waveguide is secured within the outer ring by the one or more posts, and wherein a second end of the interior dielectric wave is coupled to the mm-wave engine.

25. The ECU of claim 24, further comprising a female portion of the connector, wherein the female portion of the connector comprises:
- a threaded surface that is coupled to the threaded surface of the outer ring;
- one or more alignment features that are each coupled with a corresponding one of the alignment features on the one or more posts; and
- an exterior dielectric waveguide passing through the female portion of the connector and aligned with the interior dielectric waveguide.

* * * * *